United States Patent [19]

Vetter et al.

[11] Patent Number: 5,294,322
[45] Date of Patent: Mar. 15, 1994

[54] ELECTRIC ARC COATING DEVICE HAVING AN ADDITIONAL IONIZATION ANODE

[75] Inventors: Jörg Vetter, Bergisch Gladbach; Nikolaus Matentzoglu, Lohmar; Manfred Schmidt-Mauer, Overath, all of Fed. Rep. of Germany

[73] Assignee: Multi-Arc Oberflachentechnik GmbH, Bergisch Gladbach, Fed. Rep. of Germany

[21] Appl. No.: 922,332

[22] Filed: Jul. 30, 1992

[30] Foreign Application Priority Data

Jul. 31, 1991 [DE] Fed. Rep. of Germany ....... 4125365

[51] Int. Cl.$^5$ ............................................. C23C 14/32
[52] U.S. Cl. ............................ 204/298.41; 204/192.38
[58] Field of Search .................... 204/192.38, 298.41; 118/50.1, 723; 219/121.11

[56] References Cited

U.S. PATENT DOCUMENTS

| | | |
|---|---|---|
| 3,793,179 | 2/1974 | Sablev et al. ..................... 204/298 |
| 4,620,913 | 11/1986 | Bergman .......................... 204/192 R |
| 5,061,684 | 10/1991 | Freller et al. ............... 204/192.38 X |

FOREIGN PATENT DOCUMENTS

| | | |
|---|---|---|
| 0309733 | 8/1988 | European Pat. Off. . |
| 0233278 | 2/1986 | Fed. Rep. of Germany ......................... 204/298.41 |
| 3829260 | 8/1988 | Fed. Rep. of Germany . |
| 61-143177 | 6/1986 | Japan . |
| 2202237 | 9/1988 | United Kingdom ........... 204/298.41 |

OTHER PUBLICATIONS

H. Randhawa et al., "Technical Note: A Review . . . Applications", Surface and Coatings Technology, 31(1987) pp. 303-318.
Von Engin Ertürk; Verschleissschutz durch TiN-Beschichtung nach dem Ion Bond-Verfahren; Jan. 1987; pp. 89-94.

*Primary Examiner*—Nam X. Nguyen
*Attorney, Agent, or Firm*—Robert W. Becker

[57] ABSTRACT

An electric arc coating is comprised of a chamber with a chamber wall for receiving the substrates to be coated. The chamber can be evacuated and be optionally filled with a reaction gas or an inert gas. The device has at least one cathode connected to a first direct current source positioned within the chamber so as to be electrically insulated. The cathode is consumed by the electric arc. A second direct current source having a higher voltage than the first direct current source is connected with its negative pole to the substrates to be coated and is electrically insulated from the chamber. A first and a second anode are provided whereby the second anode is electrically insulated from the first anode and connected to a third current source. The positive poles of the first and the second current sources are connected to at least the first anode.

14 Claims, 1 Drawing Sheet

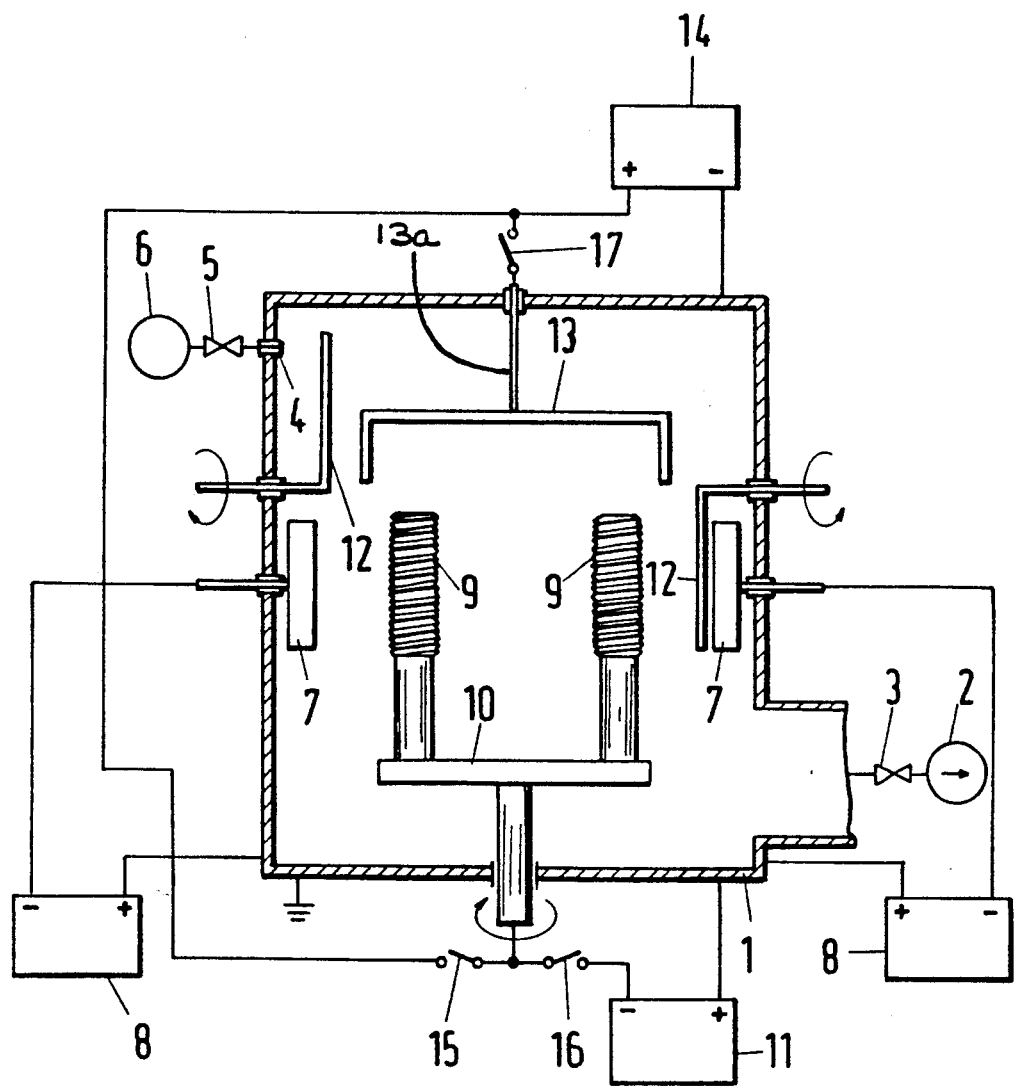

ELECTRIC ARC COATING DEVICE HAVING AN ADDITIONAL IONIZATION ANODE

BACKGROUND OF THE INVENTION

The present invention relates to an electric arc coating device having:

a chamber with a chamber wall for receiving the substrates to be coated, the chamber being evacuatable and optionally controllably fillable with a reaction gas or an inert gas;

cathodes connected within the chamber so as to be electrically insulated from the chamber and consumable by the electric arc and connected to a first direct current source;

a second direct current source having a higher voltage than the first direct current source, with the negative pole of the second direct current source connected to the substrates to be coated which are electrically insulated relative to the chamber, whereby the positive poles of the first and second direct current sources are connected to at least one first anode.

Electric arc coating devices of the aforementioned kind are essentially known from U.S. Pat. No. 3,793,179. Further developments have been reported in the publication VDI-Zeitschrift 129 (1987) No. 1, p. 89-94.

In order to ensure good adhesion of the coatings, usually consisting of zirconium nitride, applied with the electric arc coating method, before the proper coating process and after chemical cleaning processes performed outside of the coating device an especially intensive cleaning of the objects to be coated, so called substrates, is carried out in which the substrates are subjected to a bombardment with ions which result from the plasma produced by the electric arc discharge. This ionic bombardment serves also to heat the substrate to a suitable temperature for the coating process. It is however disadvantageous that especially during manufacturing of substrates with uneven mass distribution and geometry overheating or etching of individual portions of the substrate will occur. Furthermore, it cannot be entirely prevented that on the surface of the substrate, despite high negative voltages of up to 1,000 volts applied thereto, intermediate layers of essentially undefined compositions are formed. Furthermore, it is desired to prevent the inclusion of microscopic particles of the material consumed by the electric arc discharge which have not been converted to the plasma stage (so-called droplets) into the coating layer because the coating's appearance and roughness is disadvantageously influenced by these droplets.

It is therefore an object of the present invention to provide an electric arc coating device of the aforementioned kind in which the ionic cleaning and heating of the substrate does not occur directly through the ions of the plasma stream, but through a glow discharge which causes an increased degree of ionization of the gases used in this stage of the process.

BRIEF DESCRIPTION OF THE DRAWING

This object, and other objects and advantages of the present invention, will appear more clearly from the following specification in conjunction with the accompanying only drawing, in which an electric arc coating device of the present invention is schematically represented.

SUMMARY OF THE INVENTION

The electric arc coating device according to the present invention is primarily comprised of a chamber with a chamber wall for receiving the substrates to be coated, the chamber evacuatable and optionally contolably fillable with a gas selected from the group consisting of a reaction gas and an inert gas; at least one first direct current source; at least one cathode connected to the first direct current source and connected within the chamber so as to be electrically insulated, the cathodes consumable by the electric arc; a second direct current source having a higher volt age than the first direct current source, the parts to be coated being connected to a negative pole of the second direct current source and electrically insulated from the chamber; a third direct current source having a higher voltage than the first direct current source; and a first anode and a second anode, the second anode electrically insulated from the first anode and connected to the third direct current source, and with positive poles of the first and the second current sources connected to at least the first anode.

Due to the positive potential of the second anode relative to the plasma, the second anode electrically insulated from the first anode, a portion of the plasma electrons is removed from the plasma and accelerated to energies which correspond to the potential difference between the plasma and the second anode. Depending on the ionization cross-section of the gases used in the process this results in an increase of the degree of ionization within the coating chamber. The cleaning of the substrate and its heating is now achieved by the gas ions hitting the substrate whereby the formation of detrimental intermediate layers is prevented.

In a further embodiment of the present invention the second anode is made of a magnetic material. This results in a reinforced effectiveness at the electrons.

In another embodiment of the present invention the chamber wall of the coating chamber is the first anode. This simplifies the construction of the device.

A further simplification of the construction of the inventive device is achieved by connecting the third direct current source with its negative pole to the chamber.

Electric arc coating devices of the aforementioned kind are commonly operated, simultaneously or in sequence, with a plurality of cathodes. This is especially true when the device has larger dimensions. In a further embodiment of the invention the second anode is spaced equally from each of the cathodes.

In another embodiment of the invention the second anode is in the form of a bracket open to at least one side, this side facing the substrates to be coated. The second anode is connected to the chamber by a stay. This embodiment is especially advantageous for achieving the desired acceleration of the electrons of the plasma.

In order to prevent soiling of the substrates with small particles of the cathode material that have not been transferred into the plasma stage, in a further embodiment of the present invention shields are provided at least for a portion of the cathodes, the shields movable between two end positions. In the first end position the shields completely block an imaginary connecting line (view) from the cathodes to the substrates to be coated and in the second end position completely open a view from the cathodes to the substrates to be coated.

The first end position is used in the preparatory stages of the coating process, especially for ionic cleaning and heating of the substrate, whereby the current density of the ions extracted from the plasma stream is strongly reduced when a negative potential is supplied to the substrate. The second end position is assumed during the proper coating process.

In another embodiment of the present invention an electrical connection is provided between the third direct current source and the substrates to be coated, the electrical connection having a first switch for interrupting electrical contact between the third direct current source and the substrates to be coated. A second switch for interrupting electrical contact between the second direct current source and the substrates to be coated is also provided. Furthermore, a third switch for interrupting electrical contact between the second anode and the third direct current source is suggested.

An electric arc coating apparatus embodied as described above may be operated according to the present invention in four different operative stages. In a first operative stage (the ionic cleaning of the substrates to be coated) the first switch is open and the second and the third switches are closed, while the shields are in their first end position. In a second operative stage, (heating the substrates to be coated) the first switch is closed and the second and third switches are open, while the shields remain in the first end position. In a third operative stage (additionally heating the second anode) the first and the third switches are closed and the second switch is open, while the shields remain in the first end position. In a fourth operative stage (the proper coating process) the first and the third switches are open and the second switch is closed, while the shields are moved into the second (open) end position.

When in the fourth operative stage, according to a further embodiment of the present invention, a carbon-containing gas is introduced into the chamber, a metal-carbon-layer is deposited due to plasma decomposition. The metal contents of the deposited layer may be regulated by moving the shields into a more or less closed position, i.e., positions between the first end position and the second end position. When the first end position is assumed, a pure carbon layer is deposited according to the present invention. With this embodiment it is no longer required to evaporate carbon (graphite) cathodes with the aid of the electric arc which is very difficult due to the inherent porosity of carbon cathodes.

DESCRIPTION OF PREFERRED EMBODIMENT

The present invention will no be described in detail with the aid of a specific embodiment utilizing the only figure.

The electric arc coating device is comprised of a chamber 1 which may be evacuated with the aid of a pump 2 switchable by a first valve 3. Subsequently the chamber 1 may be filled with a gas to be used in the coating process, for example, a carbon-containing gas, that is supplied via an inlet line 4 closable by a second valve 5 from one or more supply containers 6 (not represented). Closely embedded into the chamber wall of the chamber 1 are evaporators 7 which in relation to the first direct current sources 8 are connected as a cathode and which are comprised of one or more of the metals to be evaporated and used in the coating to be deposited, for example, titanium. When an electric arc discharge is ignited by means which are not further represented in the drawing between the evaporates (cathodes) 7 and the chamber wall of the chamber 1 which is connected as an anode, the cathode material is evaporated and almost entirely transferred into the plasma stage. The material in the plasma stage may then react with the process gasses introduced into the chamber, for example, nitrogen or acetylene, and form, for example, titanium nitride or titanium carbide which is then deposited on the substrates 9, for example, tools for cutting. These substrates 9 are supported on a holding device 10 which is rotatable by a means, not represented in the drawing, in order to provide for a uniform coating on all sides of the substrate.

The substrates 9 may be connected as a cathode to a second direct current source 11 by a second switch 16. While the first direct current sources 8 are preferably operated at a voltage of 40 V and currents of up to 300 A, the second direct current source 11 supplies voltages up to 1500 V and currents up to 20 A. This ensures that the coating material formed by the reaction in the plasma phase is preferably deposited on the substrates 9 and only to a minute portion on undesirable locations, such as the chamber wall of the chamber 1.

Before the start of the proper coating process a heating of the substrates 9 to the required process temperature, for example, 200° to 500° C., as well as a cleaning of the surfaces of the substrates 9, for example, removal of oxide layers formed in air, are necessary. It is essentially possible to perform these steps by directly bombarding the substrates 9 with the ions of the plasma formed by the electric arc discharge; however, it is advantageous to shield the substrates 9 from the direct action of the evaporators (cathodes) 7 by pivoting the shields 12 into the direct line of emission of the cathodes 7. This is shown in the right half of the drawing, while in the left half of the drawing the position of the shield 12 during the proper coating process is represented. In addition, a second bracket-shaped anode 13, connected to the chamber by a stay 13a, is provided which is spaced equally from the various evaporators (cathodes) 7 and is connected as an anode to the third direct current source 14 by the third switch 17. The third direct current source 14 supplies a voltage of up to 100 V and currents up to 300 A. The third direct current source 14 may also be connected by a first switch 15 to the substrates 9 to be coated. The second anode 13 reinforces the degree of ionization within the chamber 1 and accelerates the ions of the plasma in the direction toward the substrates 9 which are accordingly subjected to a gentle cleaning and heating process. Due to the fact that the chamber 1 as well as the respective free poles of the various direct current sources B, 11, 14 are grounded, these components of the device are electrically connected to a unit in which only the third direct current source 14 is grounded with its cathode, while the other direct current sources are grounded with their respective anode.

For the different operating stages the following switch and shield positions are necessary:

|  | Switch 15 | Switch 16 | Switch 17 | Shields |
| --- | --- | --- | --- | --- |
| 1. Ionic cleaning of substrates 9 | open | closed | closed | closed |
| 2. Heating of substrates 9 | closed | open | open | closed |
| 3. Additional heating of the anode 13 | closed | open | closed | closed |

-continued

|  | Switch 15 | Switch 16 | Switch 17 | Shields |
|---|---|---|---|---|
| 4. Coating of the substrates 9 | open | closed | open | open to closed |

The present invention is, of course, in no way restricted to the specific disclosure of the specification and drawings, but also encompasses any modifications within the scope of the appended claims.

What we claim is:

1. An electric arc coating device for coating substrates, said device comprising:
   a chamber with a chamber wall for receiving the substrates to be coated, said chamber evacuatable and optionally controllably fillable with a gas selected from the group consisting of a reaction gas and an inert gas;
   at least one first direct current source;
   at least one cathode connected to said first direct current source and connected within said chamber so as to be electrically insulated, said cathodes consumable by the electric arc;
   a second direct current source having a higher voltage than said first direct current source, the substrates to be coated connected to a negative pole of said second direct current source and electrically insulated from said chamber;
   a third direct current source having a higher voltage than said first direct current source; and
   a first anode and a second anode, said second anode electrically insulated from said first anode and connected to said third direct current source, and with positive poles of said first and said second current sources connected to said first anode.

2. A device according to claim 1, wherein said second anode is made of a magnetic material.

3. A device according to claim 1, wherein said first anode is in the form of said chamber wall.

4. A device according to claim 1, wherein said third direct current source with its negative pole is connected to said chamber.

5. A device according to claim 1, wherein a plurality of said cathodes is provided and wherein said second anode is spaced equally from each said cathodes.

6. A device according to claim 5, further comprising a stay for connecting said second anode to said chamber and wherein said second anode is in the form of a bracket open to at least one side, said one side facing the substrates to be coated.

7. A device according to claim 1, further comprising shields connected to said chamber for shielding at least a portion of said cathodes, said shields being movable between a first and a second end position, wherein in said first end position said shields completely block a view from said cathodes to the substrates to be coated and in said second end position completely open a view from said cathodes to the substrates to be coated.

8. A device according to claim 7, further comprising:
   an electrical connection between said third direct current source and the substrates to be coated, said electrical connection having a first switch for interrupting electrical contact between said third direct current source and the substrates to be coated;
   a second switch for interrupting electrical contact between said second direct current source and the substrates to be coated; and
   a third switch for interrupting electrical contact between said second anode and said third direct current source.

9. A device according to claim 8, wherein, for ionic cleaning of the substrates to be coated, said first switch is open, said second and said third switches are closed, and said shields are in said first end position.

10. A device according to claim 8, wherein, for heating the substrates to be coated, said first switch is closed, said second and said third switches are open, and said shields are in said first end position.

11. A device according to claim 8, wherein, for heating the substrates to be coated and said second anode, said first switch and said third switch are closed, said second switch is open, and said shields are in said first end position.

12. A device according to claim 8, wherein, for coating the substrates to be coated, said first switch and said third switch are closed, said second switch is open, and said shields are in said second end position.

13. A device according to claim 12, wherein, for coating the substrates to be coated with a mixed metal-carbon-layer, said cathodes are made of metal and the reaction gas is a carbon-containing gas.

14. A device according to claim 13, wherein, for coating the substrates to be coated with a carbon-layer, said shields are moved into said first position.

* * * * *